(12) United States Patent
Lin (10) Patent No.: US 10,345,157 B2
(45) Date of Patent: Jul. 9, 2019

(54) ON-CHIP TEMPERATURE SENSING DEVICE (71) Applicant: Silicon Integrated Systems Corp., Hsinchu (TW)

(72) Inventor: Song-Sheng Lin, Hsinchu (TW)

(73) Assignee: SILICON INTEGRATED SYSTEMS CORP., Hsinchu (TW)

( * ) Notice: Subject to any disclaimer, the term of this patent is extended or adjusted under 35 U.S.C. 154(b) by 632 days.

(21) Appl. No.: 14/254,683

(22) Filed: Apr. 16, 2014

(65) Prior Publication Data

US 2015/0300890 A1 Oct. 22, 2015

(51) Int. Cl.
*G01K 7/01* (2006.01)
*H03K 3/03* (2006.01)
*H03K 3/0231* (2006.01)

(52) U.S. Cl.
CPC .............. *G01K 7/01* (2013.01); *H03K 3/0231* (2013.01); *H03K 3/0315* (2013.01)

(58) Field of Classification Search
None
See application file for complete search history.

(56) References Cited

U.S. PATENT DOCUMENTS

| | | | | |
|---|---|---|---|---|
| 4,399,565 A * | 8/1983 | Jarret | ................ | H04B 10/6911 340/556 |
| 2002/0150141 A1* | 10/2002 | Kishi | ................ | G01K 7/32 374/141 |
| 2003/0071691 A1* | 4/2003 | Boerstler | ............ | H03K 3/0315 331/57 |
| 2003/0156622 A1* | 8/2003 | Gold | ................ | G01K 7/01 374/170 |
| 2008/0238563 A1* | 10/2008 | Kim | ................ | G01K 7/32 331/176 |
| 2010/0164552 A1* | 7/2010 | Luria | ................ | G01K 7/01 327/101 |
| 2012/0197593 A1* | 8/2012 | Guo | ................ | G01R 31/2648 702/170 |

(Continued)

OTHER PUBLICATIONS

Texas Instruments, "SN54ALS520, SN74ALS518, SN74ALS520, SN74ALS521 8-BIT Identity Comparators", Nov. 1995 (Year: 1995).*

*Primary Examiner* — Alexander Satanovsky
*Assistant Examiner* — Brent A. Fairbanks
(74) *Attorney, Agent, or Firm* — Maschoff Brennan (57) ABSTRACT An on-chip temperature sensing device is disclosed. The disclosed on-chip temperature sensing device is capable of sensing an environmental temperature of the chip. The device comprises a reference generating circuit, a first oscillator, a second oscillator, and an arithmetic logic unit. The reference generating circuit is configured to generate a first control voltage to control the first oscillator and the second oscillator. The bias current of the first oscillator and the bias current of the second oscillator are both controlled by the first control voltage so that the bias current of the first oscillator is directly proportional the bias current of the second oscillator regardless the environmental temperature. The first oscillator generates a first oscillation signal, while the second oscillator generates a second oscillation signal. The arithmetic logic unit may calculate the environmental temperature according to the first oscillation signal and the second oscillation signal.

18 Claims, 10 Drawing Sheets

(56) References Cited

U.S. PATENT DOCUMENTS

| | | | |
|---|---|---|---|
| 2012/0307867 A1* | 12/2012 | Chung | G01K 7/32 374/170 |
| 2014/0084965 A1* | 3/2014 | Ahn | H03K 17/30 327/109 |
| 2014/0286472 A1* | 9/2014 | Iwasa | G01K 7/203 377/25 |

* cited by examiner

ON-CHIP TEMPERATURE SENSING DEVICE

BACKGROUND

Field

The present disclosure generally relates to an on-chip temperature sensing device, and particularly to an on-chip temperature sensing device without external reference clock signal.

Related Art

The temperature sensing technique is necessary in modern integrated circuit technology. The characteristics of integrated circuits may vary as the temperature of the integrated circuits varies. However, when the integrated circuits work, the temperature of the integrated circuit does vary. In certain aspects of application of the integrated circuit, the characteristics of the integrated circuits are very important to the metrics of the integrated circuits so that it is necessary to compensate the variation of the characteristics of the integrated circuits. A simple compensation technique is to compensate the integrated circuits according to the temperature of the integrated circuits. As a conclusion, the temperature sensing technique, capable of being utilized in the integrated circuits, is necessary in modern integrated circuit technology.

Conventionally, the temperature sensing technique utilized in the integrated circuits need an external clock signal as a reference signal. However, in certain applications, there is no external clock signal being the reference signal due to cost and there is no temperature independent clock source being stable enough to be the reference. Hence, an on-chip temperature sensing device without external reference clock signal is needed.

SUMMARY OF THE INVENTION

In one or more exemplary embodiments of this disclosure, an on-chip temperature sensing device is disclosed. The disclosed on-chip temperature sensing device is capable of sensing an environmental temperature of the chip without external clock signal as a reference or for the sake of calibration. The device comprises a reference generating circuit, a first oscillator, a second oscillator, and an arithmetic logic unit. The reference generating circuit is configured to generate a first control voltage to control the first oscillator and the second oscillator. The bias current of the first oscillator and the bias current of the second oscillator are both controlled by the first control voltage so that the bias current of the first oscillator is directly proportional the bias current of the second oscillator regardless the environmental temperature. The first oscillator generates a first oscillation signal, while the second oscillator generates a second oscillation signal. The relationship between the frequency of the first oscillation signal and the environmental temperature is the temperature characteristic of the first oscillator, and the relationship between the frequency of the second oscillation signal and the environmental temperature is the temperature characteristic of the second oscillator. The temperature characteristic of the first oscillator is different from the temperature characteristic of the second oscillator. As a result, the arithmetic logic unit may calculate the environmental temperature according to the first oscillation signal and the second oscillation signal.

In order to make the aforementioned and other features of the present disclosure more comprehensible, several embodiments accompanied with figures are described in detail below.

BRIEF DESCRIPTION OF THE DRAWINGS

The present disclosure will become more fully understood from the detailed description given herein below for illustration only, and thus are not limitative of the present disclosure, and wherein.

DETAILED DESCRIPTION OF THE INVENTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
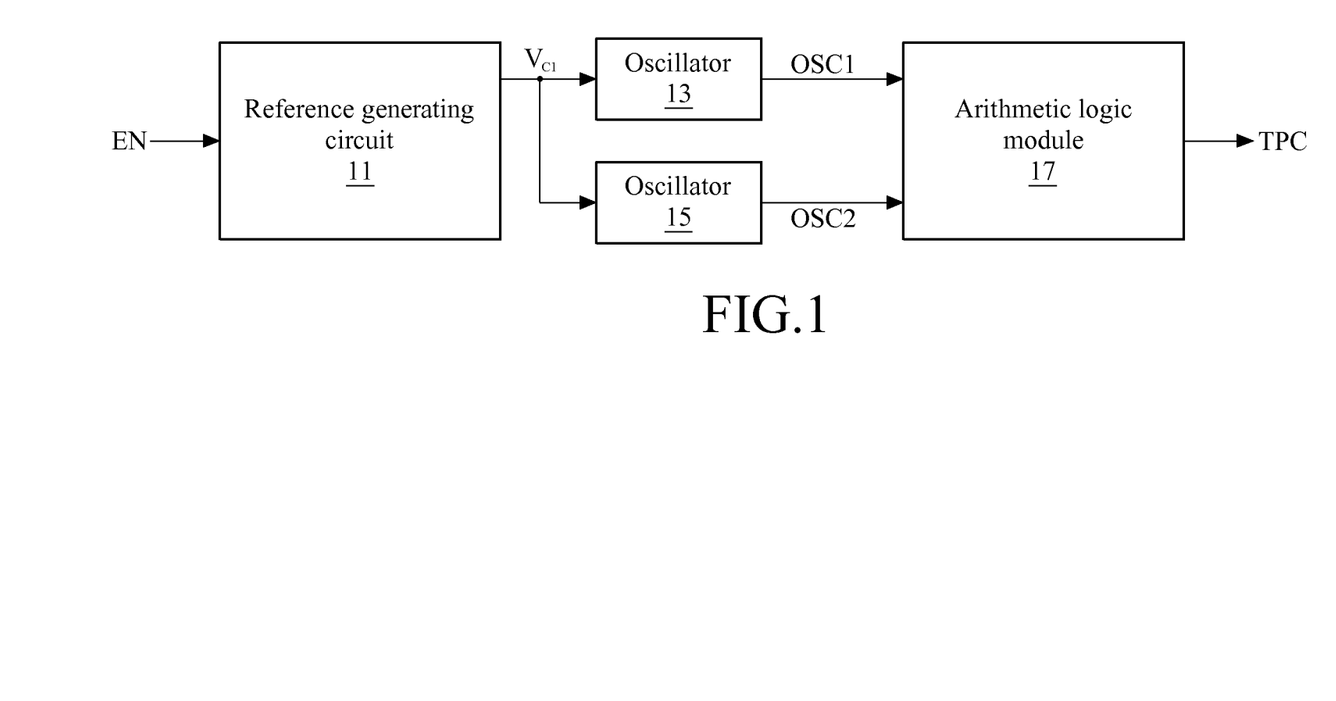
FIG. 1 is a schematic of the on-chip temperature sensing device in one embodiment of this invention.

Please refer to FIG. 1, which is a schematic of the on-chip temperature sensing device in one embodiment of this invention. As shown in FIG. 1, an on-chip temperature sensing device 1 may comprise a reference generating circuit 11, an oscillator 13, an oscillator 15, and an arithmetic logic module 17. In one embodiment, the reference generating circuit 11 is enabled by an enabling signal EN to generate a control voltage $V_{c1}$ to control the oscillator 13 and the oscillator 15. The oscillator 13 and the oscillator 15 are both coupled to the reference generating circuit and generate an oscillation signal OSC1 and an oscillation signal OSC2, respectively. The arithmetic logic module 17 is coupled to the oscillator 13 and the oscillator 15 to calculate a frequency ratio to be the Temperature Codeword TPC, bijective to an environmental temperature, according to the oscillation signal OSC1 and the oscillation signal OSC2.

Figure 2A:
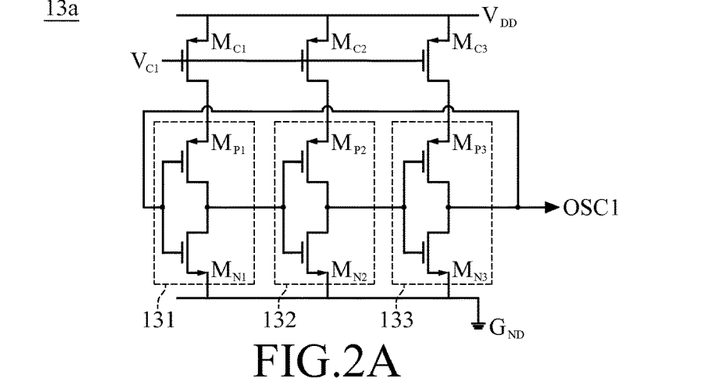
FIG. 2A is a schematic of the oscillator in one embodiment of this invention.

Each of the oscillator 13 and the oscillator 15 may be a ring oscillator comprising (2N+1) inverters. Please refer to FIG. 2A, which is a schematic of the oscillator in one embodiment of this invention. As shown in FIG. 2A, an oscillator in accordance with this invention, i.e., the oscillator 13 or the oscillator 15, may comprise three inverters. Take the oscillator 13 for example. The oscillator 13a, one embodiment of the oscillator 13, may comprise a first inverter 131, a second inverter 132, and a third inverter 133. The first inverter 131 is composed of a P-type metal-oxide semiconductor field effect transistor (P-type MOSFET) $M_{P1}$ and an N-type MOSFET $M_{N1}$. Similarly, a second inverter 132 is composed of a P-type MOSFET $M_{P2}$ and an N-type MOSFET $M_{N2}$, while a third inverter 133 is composed of a P-type MOSFET $M_{P3}$ and an N-type MOSFET $M_{N3}$. Each inverter is coupled between a first reference port $V_{DD}$, connected to the supply voltage source of the chip, and a second reference port $G_{ND}$, connected to the ground of the chip.

In addition, as shown in FIG. 2A, a first current supplied to the first inverter 131 may be limited by a first current limiter $M_{c1}$, coupled between the first inverter 131 and the first reference port $V_{DD}$, and a second current supplied to the second inverter 132 may be limited by a second current limiter $M_{c2}$, coupled between the first inverter 131 and the first reference port $V_{DD}$, and a third current supplied to the third inverter 133 may be limited by a third current limiter $M_{c3}$, coupled between the first inverter 131 and the first reference port $V_{DD}$. All of the first current limiter $M_{c1}$, the second current limiter $M_{c2}$, and the third current limiter $M_{c3}$ are controlled by the control voltage $V_{c1}$.

Figure 2B:
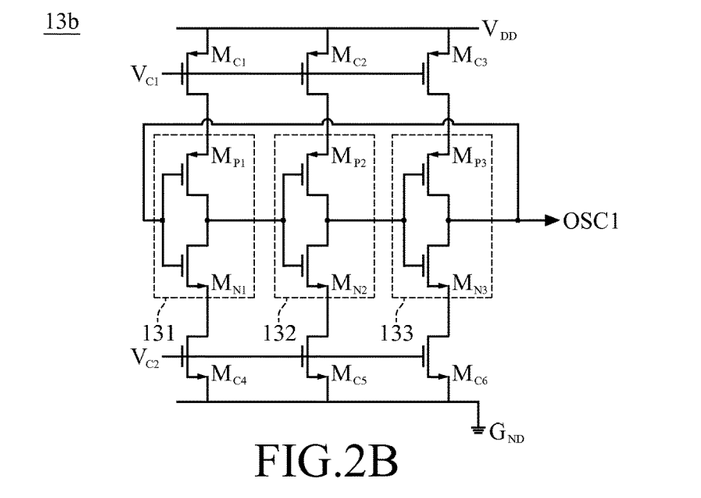
FIG. 2B is a schematic of the oscillator in another embodiment of this invention.

In another embodiment of this invention, please refer to FIG. 2B, which is a schematic of the oscillator in another embodiment of this invention. Compared with the oscillator in FIG. 2A, the oscillator 13b, another embodiment of the oscillator 13, may further comprise a fourth current limiter $M_{c4}$ coupled between the first inverter 131 and the second reference port $G_{ND}$, a fifth current limiter $M_{c5}$ coupled between the second inverter 132 and the second reference port $G_{ND}$, and a sixth current limiter $M_{c6}$ coupled between the third inverter 133 and the second reference port $G_{ND}$. The fourth current limiter $M_{c4}$ is controlled by a control voltage $V_{c2}$ to define a maximum value of a fourth current drained from the first inverter 131 to the second reference port $G_{ND}$. The control voltage $V_{c2}$ may be also generated by the reference generating circuit 11. The fifth current limiter $M_{c5}$ is controlled by the control voltage $V_{c2}$ to define a maximum value of a fifth current drained from the second inverter 132 to the second reference port $G_{ND}$. The sixth current limiter $M_{c6}$ is controlled by a control voltage $V_{c2}$ to define a maximum value of a sixth current drained from the third inverter 133 to the second reference port $G_{ND}$.

Figure 2C:
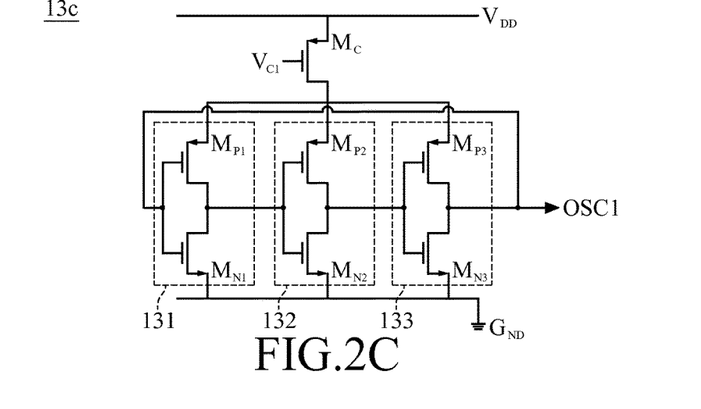
FIG. 2C is a schematic of the oscillator in yet another embodiment of this invention.

Yet in another embodiment of this invention, please refer to FIG. 2C, which is a schematic of the oscillator in yet another embodiment of this invention. Compared with the oscillator in FIG. 2A, there is only one current limiter $M_c$ having two ends. A first end of the current limiter $M_c$ is connected to the first reference port $V_{DD}$, while a second end of the current limiter $M_c$ is connected to the first inverter 131, the second inverter 132, and the third inverter 133. It is shown that the current limiter $M_c$ is controlled by the control voltage $V_{c1}$ to define a maximum value of a current supplied to all three inverters.

In one embodiment, if the oscillator 13 and the oscillator 15 both have the circuit schematic as shown in FIG. 2B, but the size of each of the transistors in the oscillator 13 is different from the size of each of the transistors in the oscillator 15, the temperature characteristic of the oscillator 13 is different from the oscillator 15. Specifically, in the present embodiment, the frequency of the oscillation signal OSC1 may be defined as 6 times of the propagation delay of one inverter in the oscillator 13. Take the first inverter 131 for example; the propagation delay of the inverter 131 may be expressed as:

$$T_{d131} \cong \frac{2C_{load131}V_{th}}{I_{max}} + \frac{C_{load131}}{K_{131}(V_{dd} - V_{th})}\ln\left(\frac{1.5V_{dd} - 2V_{th}}{0.5V_{dd}}\right) \quad (1)$$

In the equation (1), $T_{d131}$ is the propagation delay of the inverter 131; $V_{dd}$ is the voltage difference between the first reference port $V_{DD}$ and the second reference port $G_{ND}$; $V_{th}$ is the threshold voltage of each of the transistors in the inverter 131; $C_{load131}$ is the capacitance value of the loading of the inverter 131; $K_{131}$ is a MOS coefficient; $I_{max}$ is a maximum value of current supplied to/drained from the inverter 131.

The oscillator 15, compared with the oscillator 13, has a propagation delay $T_{d151}$ different from the propagation delay $T_{131}$ because the equivalent channel width of each transistor of the oscillator 15 is different from the equivalent channel width of each transistor of the oscillator 13. More specifically, the propagation delay of one inverter of the oscillator 15 may be expressed as:

$$T_{d15} \cong \frac{2C_{load15}V_{th}}{I_{max}} + \frac{C_{load15}}{K_{15}(V_{dd} - V_{th})}\ln\left(\frac{1.5V_{dd} - 2V_{th}}{0.5V_{dd}}\right) \quad (2)$$

In the equation (2), $T_{d15}$ is the propagation delay of each inverter of the oscillator 15; $V_{dd}$ is the voltage difference between the first reference port $V_{DD}$ and the second reference port $G_{ND}$; $V_{th}$ is the threshold voltage of each of the transistors in each inverter of the oscillator 15; $C_{load131}$ is the capacitance value of the loading of each inverter of the oscillator 15; $K_{15}$ is a MOS coefficient; $I_{max}$ is a maximum value of current supplied to/drained from each inverter of the oscillator 15.

In one embodiment, as the environmental temperature varies, the coefficient $K_{131}$ in the equation (1) is directly proportional to the capacitance value $C_{load131}$ with a ratio α, while the constant $K_{15}$ in the equation (2) is roughly directly proportional to the capacitance value $C_{load15}$ with the ratio α. The maximum value of current $I_{max}$ is not proportional to the capacitance value $C_{load131}$ and the capacitance value $C_{load15}$ with the ratio α. As a consequence, as the environmental temperature varies, a ratio between the propagation delay $T_{d131}$ and the propagation delay $T_{d15}$ varies, and the ratio between the frequency of the oscillation signal OSC1 and the frequency of the oscillation signal OSC2 also varies. Hence, the environmental temperature can be calculated according to the Temperature Codeword TPC, which represents the frequency ratio between the frequency of the oscillation signal OSC1 and the frequency of the oscillation signal OSC2. Additionally, the ratio between the frequency of the oscillation signal OSC1 and the frequency of the oscillation signal OSC2 is barely related to the voltage $V_{dd}$ and the maximum value of current $I_{max}$ because both the voltage $V_{dd}$ and the maximum value of current $I_{max}$ are equally applied to the oscillator 13 and the oscillator 15.

Figure 3:
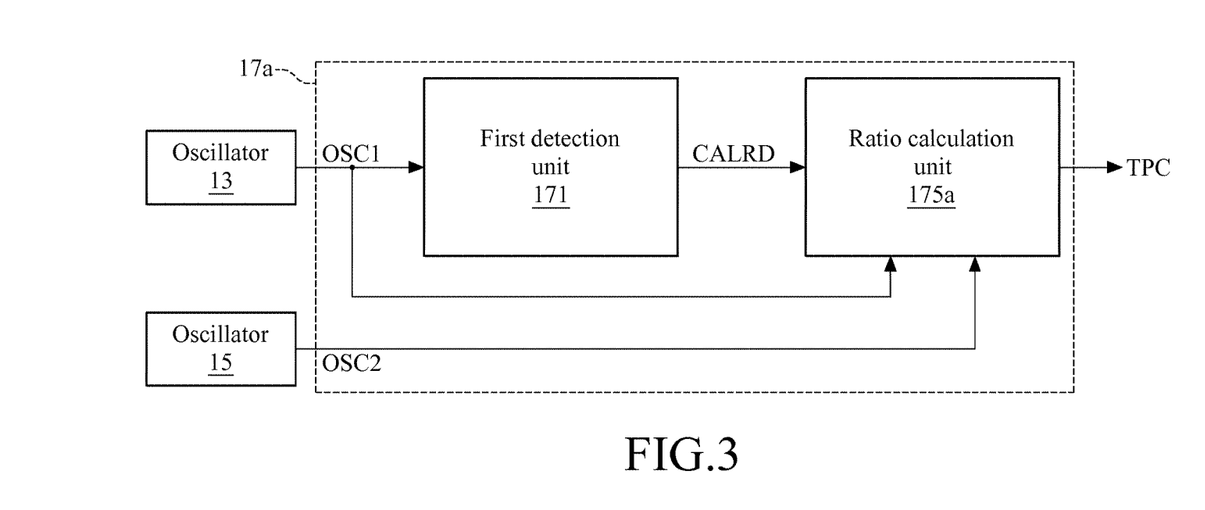
FIG. 3 is a schematic of the arithmetic logic module in one embodiment of this invention.

The arithmetic logic module 17 is configured to calculate the Temperature Codeword TPC, representing or indicating the frequency ratio, according to the oscillation signal OSC1 and the oscillation signal OSC2. However, the arithmetic logic module 17 can obtain the Temperature Codeword TPC correctly only when the oscillation signal OSC1 and the oscillation signal OSC2 are both stable. That is, the arithmetic logic module 17 has to determine whether the oscillation signal OSC1 and the oscillation signal OSC2 are both stable. In one embodiment, please refer to FIG. 3, which is a schematic of the arithmetic logic module in one embodiment of this invention. As shown in FIG. 3, the arithmetic logic module 17a, one embodiment of the arithmetic logic module 17, may comprise a first detection unit 171 and a ratio calculation unit 175a. In this embodiment, the frequency of the oscillation signal OSC1 is lower than the frequency of the oscillation signal OSC2, so if the oscillation signal OSC1 is stable, the oscillation signal OSC2 is also stable. As a consequence, the first detection unit 171 may be coupled to the oscillator 13 to detect whether the oscillation signal OSC1 is stable, while the ratio calculation unit 175a may be coupled to the first detection unit 171, the oscillator 13, and the oscillator 15.

Figure 4A:
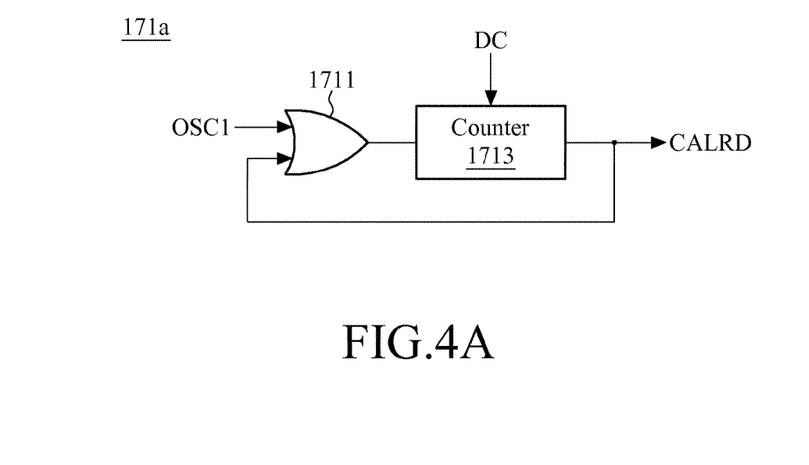
FIG. 4A is a schematic of the first detection unit in one embodiment of this invention.

The first detection unit 171 is configured to detect whether the oscillation signal OSC1 is stable to generate a ready signal CALRD. In one embodiment, please refer to FIG. 4A, which is a schematic of the first detection unit in one embodiment of this invention. As shown in FIG. 4A, the first detection unit 171a may comprise an OR-gate 1711 and a counter 1713. The OR-gate 1711 generates an output signal according to the oscillation signal OSC1 and the ready signal CALRD, Hence, if the ready signal CALRD is at logic low level, the OR-gate 1711 acts as a buffer so that the output signal of the OR-gate 1711 is logically identical to the oscillation signal OSC1. If the ready signal CALRD is at logic high level, the output signal of the OR-gate 1711 is a logic high level. The counter 1713 counts according to the edges (positive edges or negative edges) of the output signal of the OR-gate 1711. Further, if the counted number according to the output signal of the OR-gate 1711 is no less/larger than a decision count DC, the counter 1713 sets the ready signal CALRD to logic high level. The spirit of this embodiment is when the oscillation signal OSC1 oscillates for a predetermined times, the oscillation signal OSC1 should be stable enough to be the base of the ratio calculation.

Figure 4B:
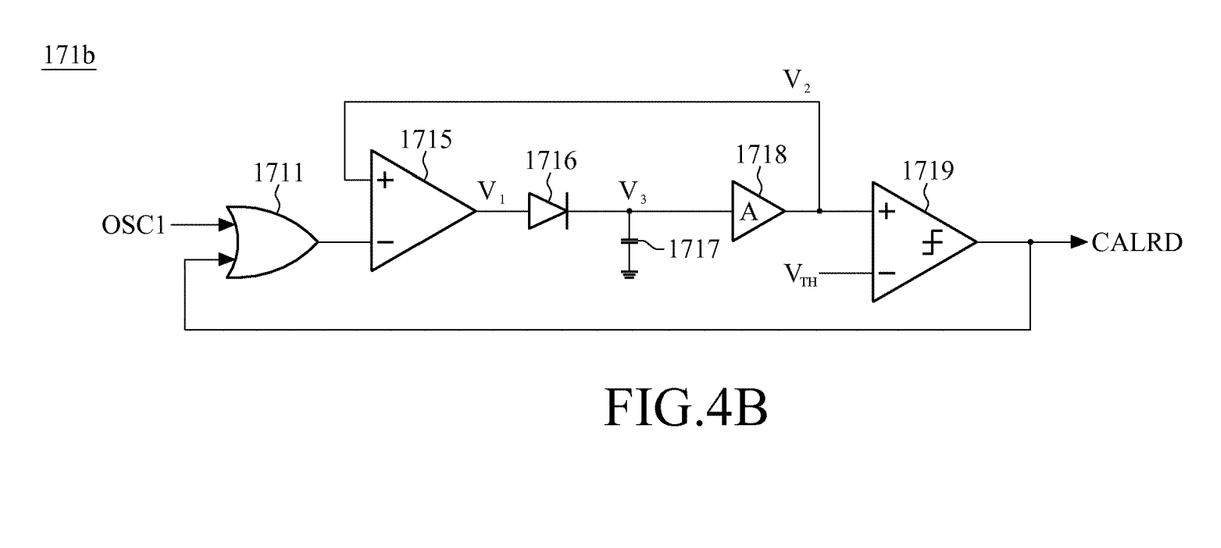
FIG. 4B is a schematic of the first detection unit in another embodiment of this invention.
Figure 4C:
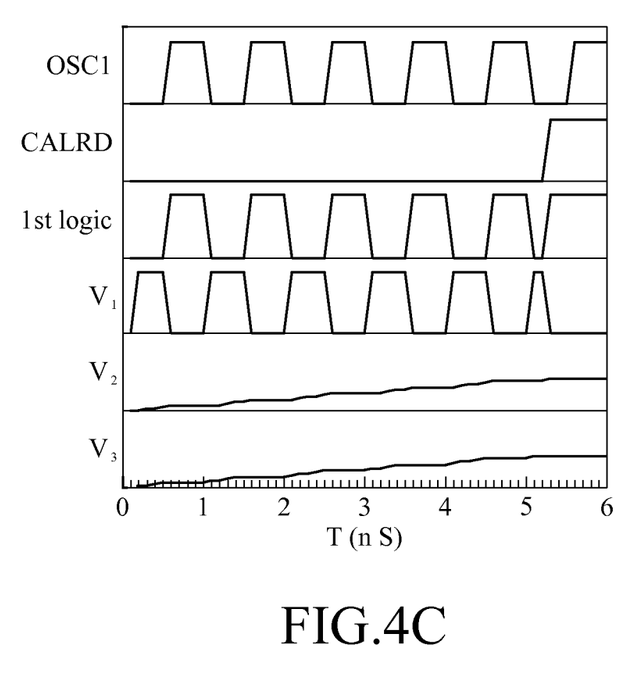
FIG. 4C is a timing diagram of a plurality of signal corresponding to FIG. 4B.

In another embodiment, please refer to FIG. 4B and FIG. 4C, wherein FIG. 4B is a schematic of the first detection unit in another embodiment of this invention, and FIG. 4C is a timing diagram of a plurality of signal corresponding to FIG. 4B. As shown in FIG. 4B, the first detection unit 171b may comprise the OR-gate 1711, an amplifier 1715, a diode 1716, a capacitor 1717, a buffer 1718, and a comparator 1719. The operation of the OR-gate 1711, generating a first logic signal according to the oscillation signal OSC1 and the ready signal CALRD, is previously depicted. The amplifier 1715 is coupled to the OR-gate 1711 and is configured to generate a first voltage $V_1$ according to the first logic signal and a second voltage $V_2$. The capacitor 1717 is coupled between the amplifier 1715 and the second reference port $G_{ND}$, and is selectively charged by the amplifier 1715 to define the voltage between two nodes of the capacitor 1717 as a third voltage $V_3$. The diode 1716 is configured to conduct a current path between the amplifier 1715 and the capacitor 1717 when the first voltage $V_1$ is larger than the third voltage $V_3$. The buffer 1718 is coupled to the capacitor 1717 to generate the second voltage $V_2$ according to the third voltage $V_3$, wherein the second voltage $V_2$ is directly proportional to the third voltage $V_3$. The comparator 1719 is coupled to the buffer 1718 to generate the ready signal CALRD by comparing the second voltage $V_2$ with a threshold voltage $V_{TH}$.

In other words, if the second voltage $V_2$ is larger than the threshold voltage $V_{TH}$, the ready signal CALRD is set to logic high level; otherwise, the ready signal CALRD is set to logic low level.

Figure 5:
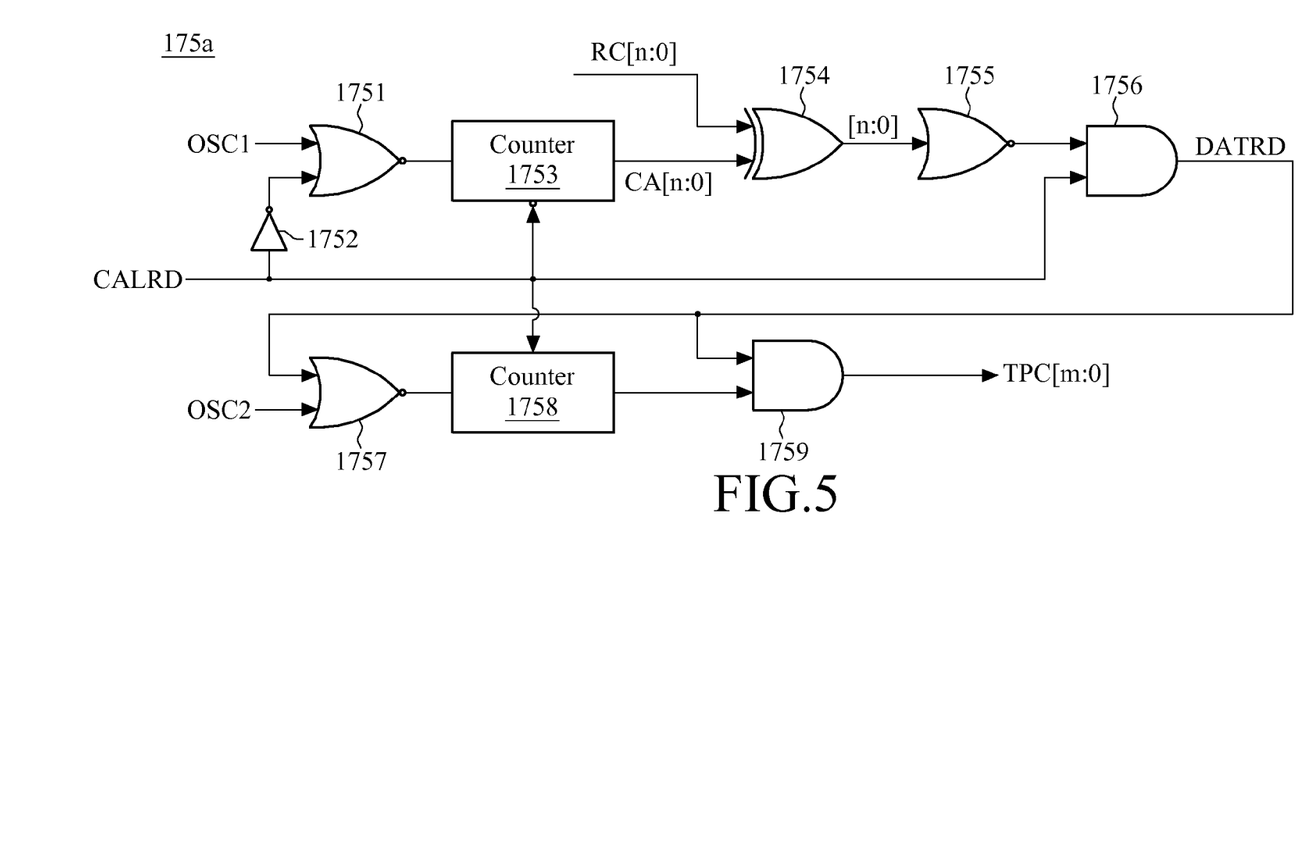
FIG. 5, which is a schematic of the ratio calculation unit in one embodiment of this invention.

When the ready signal CALRD is at logic high level, the ratio calculation unit 175a starts to calculate the Temperature Codeword TPC, indicating or representing the frequency ratio between the frequency of the oscillation signal OSC1 and the oscillation signal OSC2. In one embodiment, please refer to FIG. 5, which is a schematic of the ratio calculation unit in one embodiment of this invention. As shown in FIG. 5, the ratio calculation unit 175a may comprise a NOR-gate 1751, an inverter 1752, a counter 1753, an XOR-logic 1754, a NOR-gate 1755, an AND-gate 1756, a NOR-gate 1757, a counter 1758, and an AND-logic 1759.

If the ready signal CALRD is at logic low level, the output signal of the NOR-gate 1751 is always at logic low level. If the ready signal CALRD is at logic high level, the output signal of the NOR-gate 1751 is opposite to the oscillation signal OSC1, and the counter 1753 is enabled by the ready signal CALRD to count according to the output signal of the NOR-gate 1751 to generate a set of count signals CA, wherein the set of the count signals CA have (n+1) bits therein. The XOR-logic 1754 has (n+1) XOR-gate therein, and the XOR-logic 1754 takes the set of the count signals CA and a set of the predetermined signals RC, also having (n+1) bits therein, as the inputs. Simply speaking, the XOR-logic 1754 performs a bit-wise exclusive-or operation on the set of the count signals CA and the set of the predetermined signals RC to generate a set of XOR signals, having (n+1) bits therein. That is, it one bit of the set of the count signals CA is different from a corresponding bit among the set of the predetermined signals RC, one corresponding bit among the set of XOR signals is set to logic high level. Under such circumstance, the output signal of the NOR-gate 1755 is set to logic low level, and a ready signal DATARD generated by the AND-gate 1756 according to the ready signal CALRD and the output signal of the NOR-gate 1755 is set to logic low level.

If the set of the count signals CA is identical to the set of the predetermined signals RC, each bit of the set of XOR signals is set to logic high level. Accordingly, the output signal of the NOR-gate 1755 is set to logic low level, and the ready signal DATARD is set to logic high level.

When the ready signal DATARD is at logic low level, the output signal of the NOR-gate 1757 is opposite to the oscillation signal OSC2. If, at the same time, the counter 1758 is enabled by the ready signal CALRD, the counter 1758 would count according to the output signal of the NOR-gate 1757. Also, the Temperature Codeword TPC, the output signal of the AND-logic 1759 is set to be zero.

When the ready signal DATARD is at logic high level, the output signal of the NOR-gate 1757 is always at logic low level and the set of the output signals of the counter 1758 is kept unchanged. Meanwhile, the AND-logic 1759, having a plurality of AND-gates, takes the set of the output signals of the counter 1758 as the Temperature Codeword TPC. As aforementioned, the Temperature Codeword TPC and the environmental temperature are bijective. Hence, the environmental temperature can be calculated according to the Temperature Codeword TPC.

Figure 6A:
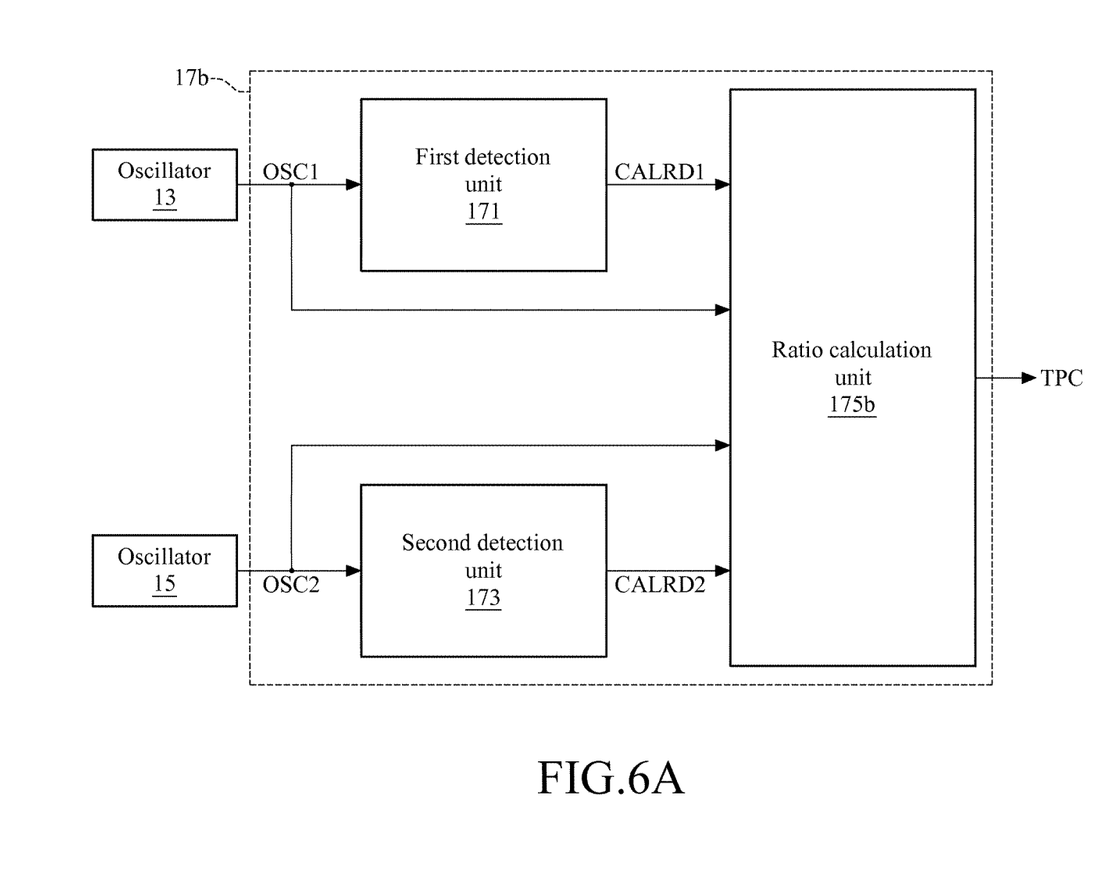
FIG. 6A is a schematic of the arithmetic logic module in one embodiment of this invention.

In another embodiment, the arithmetic logic module 17 may determine whether the oscillation signal OSC1 and the oscillation signal OSC2 are both stable. In this embodiment, please refer to FIG. 6A, which is a schematic of the arithmetic logic module in one embodiment of this invention. As shown in FIG. 6A, the arithmetic logic module 17b, one embodiment of the arithmetic logic module 17, may comprise a first detection unit 171, a second detection unit 173, and a ratio calculation unit 175b. The first detection unit 171 is coupled to the oscillator 13 to generate a ready signal CALRD1 according to the oscillation signal OSC1, while the second detection unit 173 is coupled to the oscillator 15 to generate a ready signal CALRD2 according to the oscillation signal OSC2. The mechanism of each of the first detection unit 171 and the second detection unit 173 is mentioned previously. The ratio calculation unit 175b is coupled to the oscillator 13, the oscillator 15, the first detection unit 171, and the second detection unit 173. The ratio calculation unit 175b is configured to generate the Temperature Codeword TPC according to the oscillation signal OSC1 and the oscillation signal OSC2 when both of the ready signal CALRD1 and the ready signal CALRD2 are at logic high level.

Figure 6B:
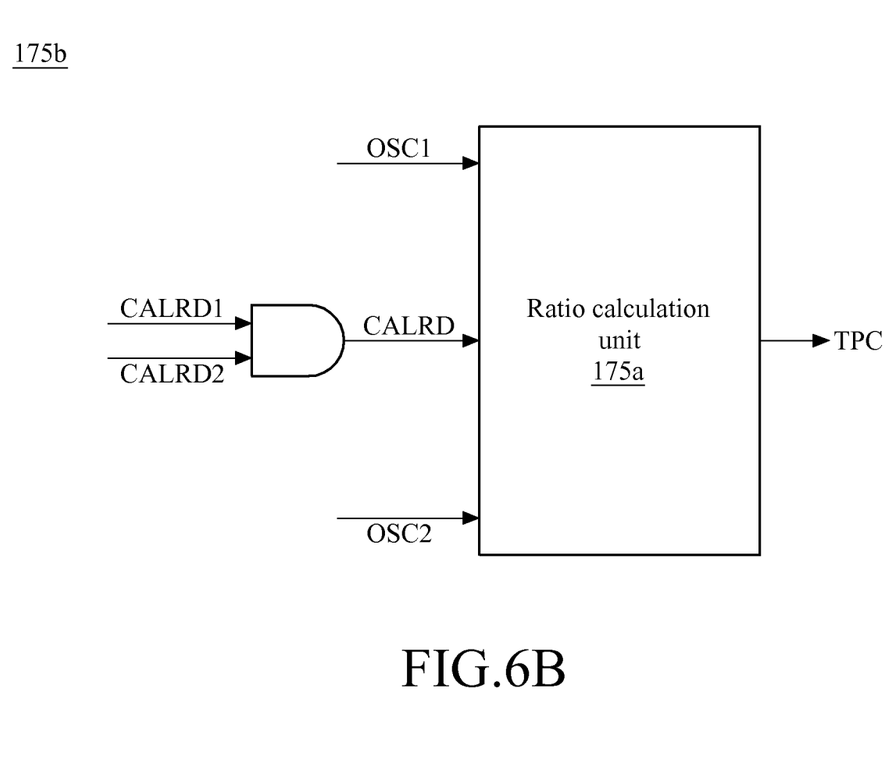
FIG. 6B is a schematic of the ratio calculation unit in one embodiment of this invention.

In this embodiment, please refer to FIG. 6B, which is a schematic of the ratio calculation unit in one embodiment of this invention. As shown in FIG. 6B, the ratio calculation unit 175 may comprise an AND-gate and the ratio calculation unit 175a. The AND-gate set the ready signal CALRD to logic high level only when both of the ready signal CALRD1 and the ready signal CALRD2 are at logic high level.

In one embodiment, the arithmetic logic module 17 may further comprise a temperature computing unit (not shown in figures). The temperature computing unit is coupled to the ratio calculation unit 175a controlled by the ready signal DATARD to calculate the environmental temperature according to the Temperature Codeword TPC. Specifically, because the frequency ratio TPC and the environmental temperature are bijective, a function depicting the relationship between the Temperature Codeword TPC, representing or indicating the frequency ratio, and the environmental temperature can be generated and stored in the temperature computing unit. The temperature computing unit may compute the environmental temperature according to the Temperature Codeword TPC and the aforementioned function.

In another embodiment, there may be a look-up table related to the Temperature Codeword TPC, indicating the frequency ratio, and the environmental temperature stored in the temperature computing unit. The temperature computing unit may obtain the environmental temperature according to the Temperature Codeword TPC and the look-up table.

Figure 7A:
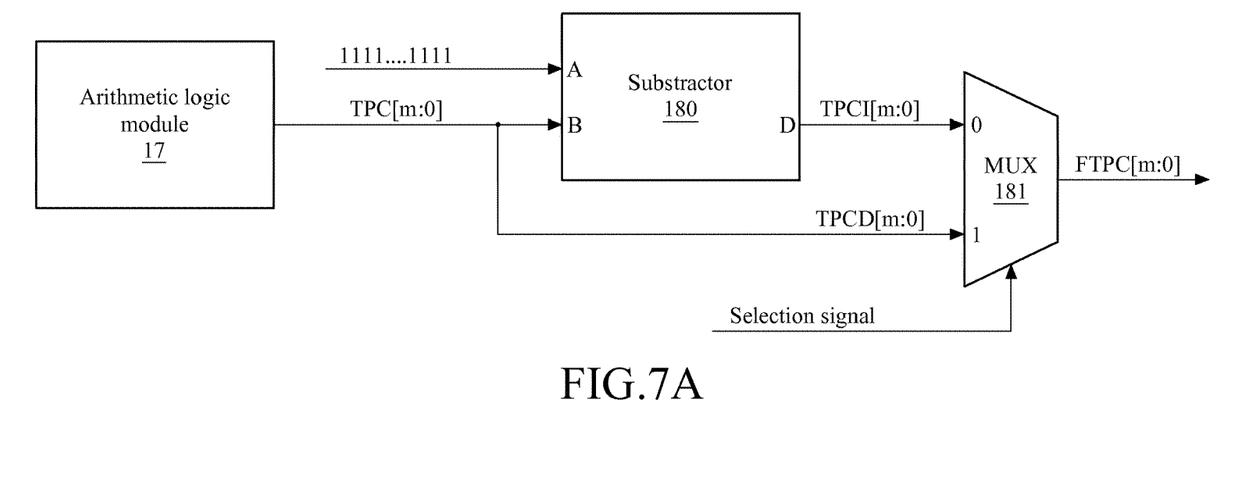
FIG. 7A is a schematic of a codeword reversing device according to one embodiment of this invention.
Figure 7B:
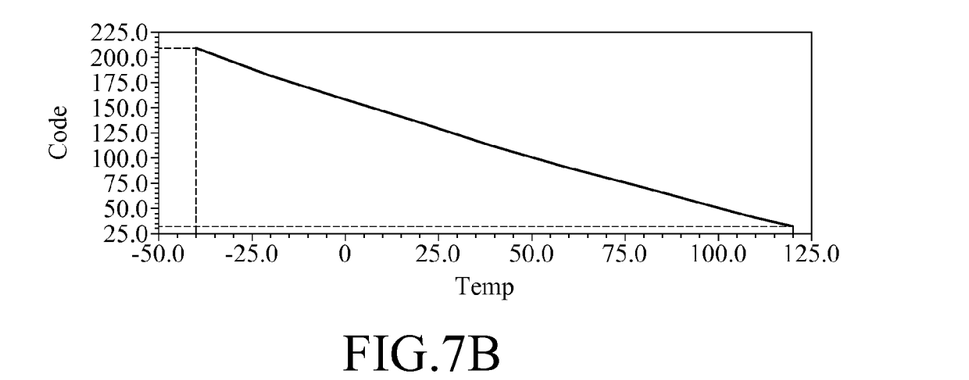
FIG. 7B is a codeword-to-temperature diagram illustrating the relationship between the decremented temperature codeword and the environmental temperature according to one embodiment of this invention.
Figure 7C:
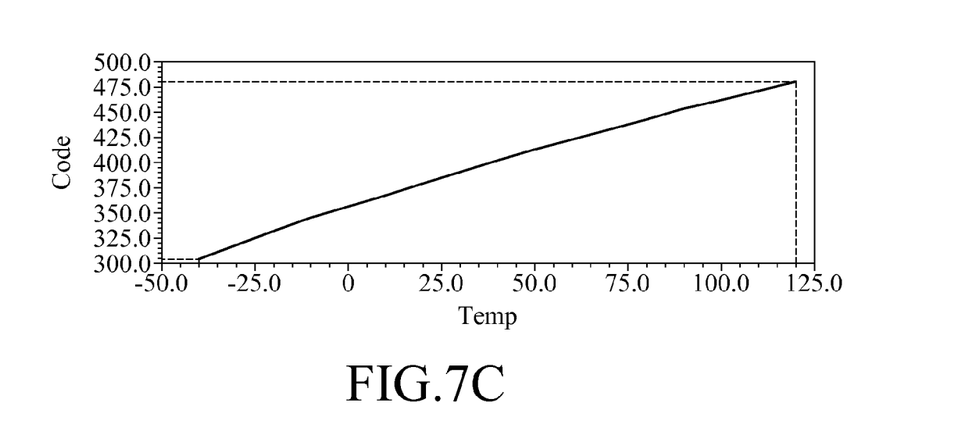
FIG. 7C is a codeword-to-temperature diagram illustrating the relationship between the incremental temperature codeword and the environmental temperature according to one embodiment of this invention.

In one embodiment, it is more convenient for a processor to compute the environmental temperature according to an incremental Temperature Codeword in certain conditions, while it is more convenient for the processor to compute the environmental temperature according to a decremented Temperature Codeword. As such, please refer to FIG. 7A, which is a schematic of a codeword reversing device according to one embodiment of this invention. As shown in FIG. 7A, a subtractor 180 is coupled to the arithmetic logic module 17 to compute an incremental Temperature Codeword TPCI by subtracting the Temperature Codeword TPC from a series of 1 of the TPC codeword length based on the resolution one is selected. Additional, a multiplexer 181 is coupled to the subtractor 180 and the arithmetic logic module 17 to respectively receive the incremental Temperature Codeword TPCI and the decremented Temperature Codeword TPCD, which is identical to the Temperature Codeword TPC, so that the output of the multiplexer 181, the Final Temperature Codeword FTPC, is generated according to the incremental Temperature Codeword TPCI, the decremented Temperature Codeword TPCD, and a selection signal. In one embodiment, the relationship between the decremented Temperature Codeword TPCD and the environmental temperature is illustrated in FIG. 7B, while the relationship between the incremental Temperature Codeword TPCI and the environmental temperature is illustrated in FIG. 7C. Such illustrations are some examples according to simulations and experiments of 8-bit resolution being selected, but not to limit the scope of this invention. In each of FIG. 7B and FIG. 7C, the horizontal axis represents the measured temperature in Celsius, while the vertical axis represents the temperature codeword.

With the disclosed temperature sensing device, it is noted that an external clock source or a temperature independent clock source is not necessary. The disclosed device calculates the frequency ratio between two oscillation signals when both oscillation signals are stable. Because the frequency ratio according to this invention varies as the environmental temperature varies, the frequency ratio in accordance with this invention may be used for calculating the environmental temperature.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An on-chip temperature sensing device, comprising:
   a reference generating circuit, configured to generate a first control voltage;
   a first oscillator coupled to the reference generating circuit, controlled by the first control voltage to output a first oscillation signal;
   a second oscillator coupled to the reference generating circuit, controlled by the first control voltage to output a second oscillation signal, wherein the temperature characteristic of the first oscillator is different from the temperature characteristic of the second oscillator; and
   an arithmetic logic circuit set coupled to the first oscillator and the second oscillator, configured to calculate an environmental temperature according to the first oscillation signal and the second oscillation signal, wherein the arithmetic logic circuit set comprises:
      a first detection circuit coupled to the first oscillator, configured to generate a first ready signal which is configured to enable a ratio calculation operation; and
      a ratio calculation circuit coupled to the first detection circuit, the first oscillator, and the second oscillator, and configured to perform the ratio calculation operation, wherein the ratio calculation operation includes generating a second ready signal according to a set of count signals corresponding to the first oscillation signal, a set of predetermined signals and the first ready signal, wherein when the set of count signals corresponding to the first oscillation signal is identical to the set of predetermined signals, the second ready signal is set to a logic high level, and obtaining a temperature codeword according to a counting result of the second oscillation signal and the second ready signal;
   wherein the temperature codeword indicates a ratio between a frequency of the first oscillation signal and a frequency of the second oscillation signal and corresponds to the environmental temperature;
   wherein the first oscillator and the second oscillator are both temperature variation oscillators.

2. The on-chip temperature sensing device according to claim 1, wherein the first oscillator comprises 2N+1 first inverters and the second oscillator comprises 2N+1 second inverters, N is an integer larger than 1.

3. The on-chip temperature sensing device according to claim 2, wherein the first inverters are identical to one another and the second inverters are identical to one another, and one of the first inverters is different from one of the second inverters.

4. The on-chip temperature sensing device according to claim 3, wherein a number of fingers of one of the first inverters is equal to a number of fingers of one of the second inverters.

5. The on-chip temperature sensing device according to claim 4, wherein an equivalent length-to-width ratio of transistors (W/L) of the first inverters is different from an equivalent W/L of the second inverters.

6. The on-chip temperature sensing device according to claim 3, wherein an equivalent length-to-width ratio of transistors (W/L) of the first inverters is equal to an equivalent W/L of the second inverters.

7. The on-chip temperature sensing device according to claim 6, wherein a number of fingers of one of the first inverters is different from a number of fingers of one of the second inverters.

8. The on-chip temperature sensing device according to claim 1, wherein each of the first oscillator and the second oscillator comprises:
a first inverter, coupled between a first reference port and a second reference port and having a first input port and a first output port;
a second inverter, coupled between the first reference port and the second reference port and having a second input port connected to the first output port and a second output port; and
a third inverter, coupled between the first reference port and the second reference port and having a third input port connected to the second output port and a third output port coupled to the first input port.

9. The on-chip temperature sensing device according to claim 8, wherein each of the first oscillator and the second oscillator further comprises:
a first current limiter, coupled between the first reference port and the first inverter, and coupled to the reference generating circuit, controlled by the first control voltage to define a first maximum value of a first current supplied to the first inverter;
a second current limiter, coupled between the first reference port and the second inverter, and coupled to the reference generating circuit, controlled by the first control voltage to define a second maximum value of a second current supplied to the second inverter; and
a third current limiter, coupled between the first reference port and the third inverter, and coupled to the reference generating circuit, controlled by the first control voltage to define a third maximum value of a third current supplied to the third inverter.

10. The on-chip temperature sensing device according to claim 9, wherein the reference generating circuit further generates a second control voltage, and each of the first oscillator and the second oscillator further comprises:
a fourth current limiter, coupled between the second reference port and the first inverter, and coupled to the reference generating circuit, controlled by the second control voltage to define a fourth maximum value of a fourth current drained from the first inverter;
a fifth current limiter, coupled between the second reference port and the second inverter, and coupled to the reference generating circuit, controlled by the second control voltage to define a fifth maximum value of a fifth current drained from the second inverter; and
a sixth current limiter, coupled between the second reference port and the third inverter, and coupled to the reference generating circuit, controlled by the second control voltage to define a sixth maximum value of a sixth current drained from the third inverter.

11. The on-chip temperature sensing device according to claim 8, wherein each of the first oscillator and the second oscillator further comprises a current limiter, coupled between the first reference port and the first inverter, the second inverter, and the third inverter, and coupled to the reference generating circuit, controlled by the first control voltage to define a maximum value of a first current supplied to the first inverter, the second inverter, and the third inverter.

12. The on-chip temperature sensing device according to claim 1, wherein the arithmetic logic circuit set further comprises:
a temperature computing circuit coupled to the ratio calculation circuit to calculate the environmental temperature according to the temperature codeword.

13. The on-chip temperature sensing device according to claim 1, wherein the first detection circuit comprises:
an OR-gate coupled to the first oscillator, configured to generate a first logic signal by performing a logic disjunction based on the first oscillation signal and the first ready signal; and
a counter coupled to the OR-gate, configured to set the first ready signal according to the first logic signal and a preset value.

14. The on-chip temperature sensing device according to claim 1, wherein the first detection circuit comprises:
an OR-gate coupled to the first oscillator, configured to generate a first logic signal by performing a logic disjunction based on the first oscillation signal and the first ready signal;
an amplifier coupled to the OR-gate, configured to generate a first voltage according to the first logic signal and a second voltage;
a capacitor coupled to the amplifier, selectively charged by the amplifier to define a third voltage;
a diode connected between the amplifier and the capacitor, configured to conduct a current path between the amplifier and the capacitor when the first voltage is larger than the third voltage;
a buffer coupled to the capacitor, configured to generate the second voltage according to the third voltage; and
a comparator coupled to the buffer and the OR-gate, configured to generate the first ready signal according to the second voltage and a threshold voltage.

15. The on-chip temperature sensing device according to claim 1, wherein the temperature characteristic of the first oscillator is a relationship between a frequency of the first oscillation signal and the environmental temperature, and the temperature characteristic of the second oscillator is a relationship between a frequency of the second oscillation signal and the environmental temperature.

16. The on-chip temperature sensing device according to claim 1, wherein the temperature codeword generated by the arithmetic logic circuit set is one of a decremented temperature codeword and an incremental temperature codeword, and the on-chip temperature sensing device further comprises:

a subtractor coupled to the arithmetic logic circuit set, configured to generate another one of the decremented temperature codeword and the incremental temperature codeword according to the temperature codeword generated by the arithmetic logic circuit set; and a multiplexer coupled to the subtractor and the arithmetic logic circuit set, configured to generate a final temperature codeword according to the decremented temperature codeword, the incremental temperature codeword, and a selection signal.

17. The on-chip temperature sensing device according to claim 1, wherein the ratio calculation circuit comprises:

a first NOR-gate, having two inputs respectively connected to the first oscillator and the first detection circuit;

a first counter, coupled to the first NOR-gate and enabled by the first ready signal to count according to an output signal of the first NOR-gate to generate a set of count signals;

a logic gate group, coupled to the first counter and the first detection circuit, and generating the second ready signal;

a second NOR-gate, having two inputs respectively connected to the second oscillator and the logic gate group to receive the second oscillation signal and the second ready signal;

a second counter, coupled to the second NOR-gate and enabled by the first ready signal to count according to an output signal of the second NOR-gate; and an AND-logic, coupled to the second counter and the logic gate group, configured to generate the temperature codeword according to a set of output signals of the second counter and the second ready signal.

18. The on-chip temperature sensing device according to claim 17, wherein the logic gate group of the ratio calculation circuit comprises:

a XOR-logic, coupled to the first counter, and configured to take the set of count signals and the set of predetermined signals to generate a set of XOR signals;

a NOR-gate, coupled to an output of the XOR-logic; and a AND-gate, coupled to an output of the NOR-gate and the first detecting circuit, and configured to generate the second ready signal according to an output signal of the NOR-gate and the first ready signal.

* * * * *